(12) United States Patent
Takahashi et al.

(10) Patent No.: US 7,075,201 B2
(45) Date of Patent: Jul. 11, 2006

(54) MULTI-PHASE ALTERNATING-CURRENT ROTATIONAL ELECTRIC MACHINE

(75) Inventors: Yoshimasa Takahashi, Chiyoda-ku (JP); Hironori Kodama, Chiyoda-ku (JP); Yutaka Kobayashi, Chiyoda-ku (JP); Keiichi Mashino, Chiyoda-ku (JP); Syouju Masumoto, Chiyoda-ku (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/642,584

(22) Filed: Aug. 19, 2003

(65) Prior Publication Data
US 2004/0183385 A1  Sep. 23, 2004

(30) Foreign Application Priority Data
Mar. 17, 2003 (JP) .............................. 2003-071211

(51) Int. Cl.
*H02K 11/00* (2006.01)
(52) U.S. Cl. ..................... 310/68 D; 310/52
(58) Field of Classification Search ............ 310/68 D, 310/68 R, 67 R, 71, 52, 64
See application file for complete search history.

(56) References Cited

U.S. PATENT DOCUMENTS

| 4,161,775 A | * | 7/1979 | Franz et al. ................ 363/145 |
| 4,541,004 A | | 9/1985 | Moore |
| 5,519,938 A | | 5/1996 | Kojima et al. |
| 5,818,133 A | * | 10/1998 | Kershaw et al. .......... 310/67 R |
| 5,825,107 A | | 10/1998 | Johnson et al. |
| 6,107,711 A | * | 8/2000 | Borchert ................... 310/68 D |
| 6,198,187 B1 | * | 3/2001 | Asao et al. ............... 310/68 D |
| 6,661,134 B1 | * | 12/2003 | Sunaga et al. ................ 310/64 |

FOREIGN PATENT DOCUMENTS

| DE | 1763103 | | 7/1971 |
| DE | 2228856 | | 1/1974 |
| DE | 44 22 623 A1 | | 1/1996 |
| EP | 1274129 A2 | | 1/2003 |
| JP | 63-305757 | | 12/1988 |
| JP | 5-316732 | | 11/1993 |
| JP | 2959640 | | 5/1995 |
| JP | 8-331818 | | 12/1996 |
| JP | 410209357 A | * | 8/1998 |

OTHER PUBLICATIONS

European Search Report mailed Feb. 23, 2004.

* cited by examiner

*Primary Examiner*—Darren Schuberg
*Assistant Examiner*—Nguyen N. Hanh
(74) *Attorney, Agent, or Firm*—Crowell & Moring LLP

(57) ABSTRACT

A multi-phase alternating-current rotational electric machine wherein semiconductor switching devices are electrically insulated from heat sinks, and the heat sinks are grounded to the housing and thermally separated in each phase.

7 Claims, 12 Drawing Sheets

COOLING AIR (INLET SIDE)   BASE SURFACE

COOLING AIR (BETWEEN FINS)

COOLING AIR (INLET SIDE)

COOLING AIR (INLET SIDE) — BASE SURFACE — 181 — 18'

COOLING AIR (INLET SIDE)

COOLING AIR (INLET SIDE)

181

BASE SURFACE

COOLING AIR (INLET SIDE)

FIG. 13

| | UH | UL | VH | VL | WH | WL | MAXIMUM TEMPERATURE DIFFERENCE (°C) BETWEEN DEVICES |
|---|---|---|---|---|---|---|---|
| CONVENTIONAL EXAMPLE | 185.9 | 181.2 | 189.5 | 180.0 | 187.6 | 178.0 | 11.5 |
| EMBODIMENT 1 (1 DEVICE/ 1 HEAT SINK) | 156.3 | 155.2 | 157.9 | 155.4 | 157.5 | 154.9 | 3.0 |
| EMBODIMENT 2 (1 DEVICE/ 1 HEAT SINK) | 151.1 | 151.5 | 150.8 | 151.3 | 150.9 | 150.6 | 0.9 |
| EMBODIMENT 3 (2 DEVICES/ 1 HEAT SINK) | 160.5 \| 161.0 | 161.2 \| 161.5 | 161.3 \| 161.4 | 160.2 \| 161.8 | 160.9 \| 161.5 | 160.8 \| 160.3 | 1.5 |
| EMBODIMENT 4 (1 DEVICE/ 1 HEAT SINK) | 145.6 | 146.5 | 145.0 | 146.6 | 146.3 | 147.0 | 2.0 |

MULTI-PHASE ALTERNATING-CURRENT ROTATIONAL ELECTRIC MACHINE

BACKGROUND OF THE INVENTION

The present invention relates to a multi-phase alternating-current rotational electric machine which controls multi-phase alternating currents by semiconductor switching devices, such as MOSFETs, IGBTs, and so on.

As the electric power load requirement increases because automobiles are becoming larger and up-graded, the demand for highly efficient and powerful automobile alternators (alternating-current generator for automobiles) is also increasing. With respect to the increased efficiency, according to the method disclosed in Japanese Patent Publication No. 2959640, the use of a MOSFET as a rectifying device reduces power losses (heat generation) more than the use of a conventional diode. With respect to high power, by mounting in parallel low power loss and low resistance MOSFETs, it is possible to rectify larger currents than the conventional method.

Especially for a rotational electric machine for automobiles, such as the above-mentioned alternator, the configuration that incorporates a power converting circuit unit into a rotational electric machine's main body (hereafter, referred to as "integral construction") is highly desirable in terms of reduction in size, weight, and cost.

However, because the rotational electric machine's main body is mounted close to the engine and exposed to extreme thermal conditions, many examples of a conventional integral alternator, which uses silicon diodes that are resistant to relatively high temperatures, have been disclosed, but only one example (Japanese Laid-open Patent Publication No. Hei 8-331818) of a conventional integral alternator, which uses SiC (silicon carbide) devices that are resistant to higher temperature compared to the silicon devices, has been disclosed. Below are detailed descriptions of problems to be solved for achieving a highly efficient, powerful, integral rotational electric machine that incorporates silicon switching devices (MOSFETs, IGBTS, and so on).

SUMMARY OF THE INVENTION

In conventional alternators, a number of diodes that correspond to the number of phases of the rectifier circuit are integrated; however, there exists the possibility that the temperature of each device could vary according to the mounting locations.

For example, as disclosed in Japanese Laid-open Patent Publication No. Sho 63-305757, when a heat sink that is designed with fins of partially different lengths is used in order to bypass the rotor shaft, the temperature of the mounted devices varies according to locations on the heat sink.

Furthermore, as disclosed in Patent Publication No. 2590490 and Japanese Laid-open Patent Publication No. Hei 5-316732, when the positive- and negative-heat sinks are separated into the stator side and the rear side, respectively, and the heat sinks are not mounted in the same cross-section as the rotor shaft(i.e. heat sinks are located one above the other), the variance of the devices' temperatures inevitably occurs because the cooling capability of both poles is different.

When using silicon diodes, even if diode temperatures vary at least 20° C. depending on mounting locations, there is little possibility of fatal destruction of the devices because they can withstand operating temperatures up to 200° C. On the other hand, the maximum operating temperature of a silicon switching device (MOSFET, IGBT, etc.) is low, from 150° C. to 175° C., and therefore, allowable temperature variance among devices is small.

Consequently, in comparison with the conventional example, it is necessary to increase cooling capability as well as reduce temperature variance. Moreover, when calculating torque from electric currents and the number of revolutions to feed back for engine control, it is necessary to accurately detect electric currents. As a result, the variance of the cooling capability that depends on the mounting locations of devices must be reduced because the temperature variance among the devices affects the accuracy of current detection.

Furthermore, in recently developed hybrid vehicles, because power supply voltage is higher than that of conventional vehicles, the demand for electrical insulation of high-voltage devices is increasing. For example, when achieving an integral rotational electric machine, such as a motor generator (hereafter referred to as "M/G") that functions as both an alternator and an engine drive motor, it is more important than in a conventional vehicle to completely insulate high-voltage, positive devices from the body-grounded rotational electric machine's housing.

Moreover, when taking an example of a three-phase alternating-current circuit, it is preferable to use the same channel type switching devices for the positive-pole side and negative-pole side of each U, V an W phase.

For example, with respect to the MOSFET, there are two types, n-channel type and p-channel type, because their switching capabilities are different due to the difference in the mobility of electrical carriers. Accordingly, when using n-channel type MOSFETs for both positive and negative switching devices, it is necessary to separate the negative electrode and heat sink for each U, V, and W phase. In the conventional diode rectifying circuit (rotational electric machine), this restriction was avoided by mounting positive and negative diodes upside down so that their poles become opposite. Therefore, this is a new problem to be solved when applying semiconductor switching devices to a rotational electric machine.

In view of the above-mentioned demand and problems, the purpose of the present invention is to provide a multi-phase alternating-current rotational electric machine which eliminates temperature variance among multiple devices, completely insulates high voltage devices from the ground and also has an appropriate configuration suitable for semiconductor switching devices, such as MOSFETs, IGBTs, etc.

An alternating-current rotational electric machine to achieve said objective is a multi-phase alternating-current rotational electric machine comprising a housing, a rotor shaft rotatably installed in the housing, a magnetized rotor fixed to the rotor shaft, a stator which is arranged such that the windings of the stator coil are wound around the stator core fixed to the housing, multiple semiconductor switching devices, installed in the housing, which adjust currents of the stator, and a heat sink fixed to the semiconductor switching devices so that heat can be conducted, wherein the semiconductor switching device is electrically insulated from the heat sink, and the heat sink is grounded to the housing as well as thermally separated in each phase.

Furthermore, an alternating-current dynamo-electric machine to achieve said objective is a multi-phase alternating-current rotational electric machine comprising
a housing,
a rotor shaft rotatably installed in the housing,
a magnetized rotor fixed to the rotor shaft,
a stator which is arranged such that the windings of the stator coil are wound around the stator core fixed to the housing,
multiple semiconductor switching devices, installed in the housing, which adjust currents of the stator, and
a heat sink fixed to the semiconductor switching devices so that heat can be conducted, wherein
the semiconductor switching device is electrically insulated from the heat sink, the heat sink is grounded to the housing, and the temperature of the multiple semiconductor switching devices is substantially determined in each phase.

Furthermore, multiple fins are arranged on the base surface of said heat sink and the substantially full flow of the air entering into said housing passes through the multiple fins.

Furthermore, multiple fins are arranged on the base surface of said heat sink and a cover, which has an opening almost identical to the projection of the heat sink in the direction of said rotor shaft, is provided.

Furthermore, the base surface of said heat sink is placed in parallel with the direction of the diameter of said rotor shaft.

Furthermore, said multiple fins of said heat sink are concentrically arranged with said rotor shaft as the center.

Furthermore, said multiple fins located on the base surface of said heat sink are columnar and the multiple columnar fins are arranged on the base surface in a lattice-like configuration.

Furthermore, said multiple fins located on the base surface of said heat sink are columnar and the multiple columnar fins are arranged on the base surface in a staggered configuration.

BRIEF DESCRIPTION OF THE DRAWINGS

FIG. 13 is a table for comparing temperatures of switching devices in embodiments 1 through 4 according to the present invention with a conventional example.

DESCRIPTION OF THE PREFERRED EMBODIMENTS (Embodiment 1)

Figure 1:
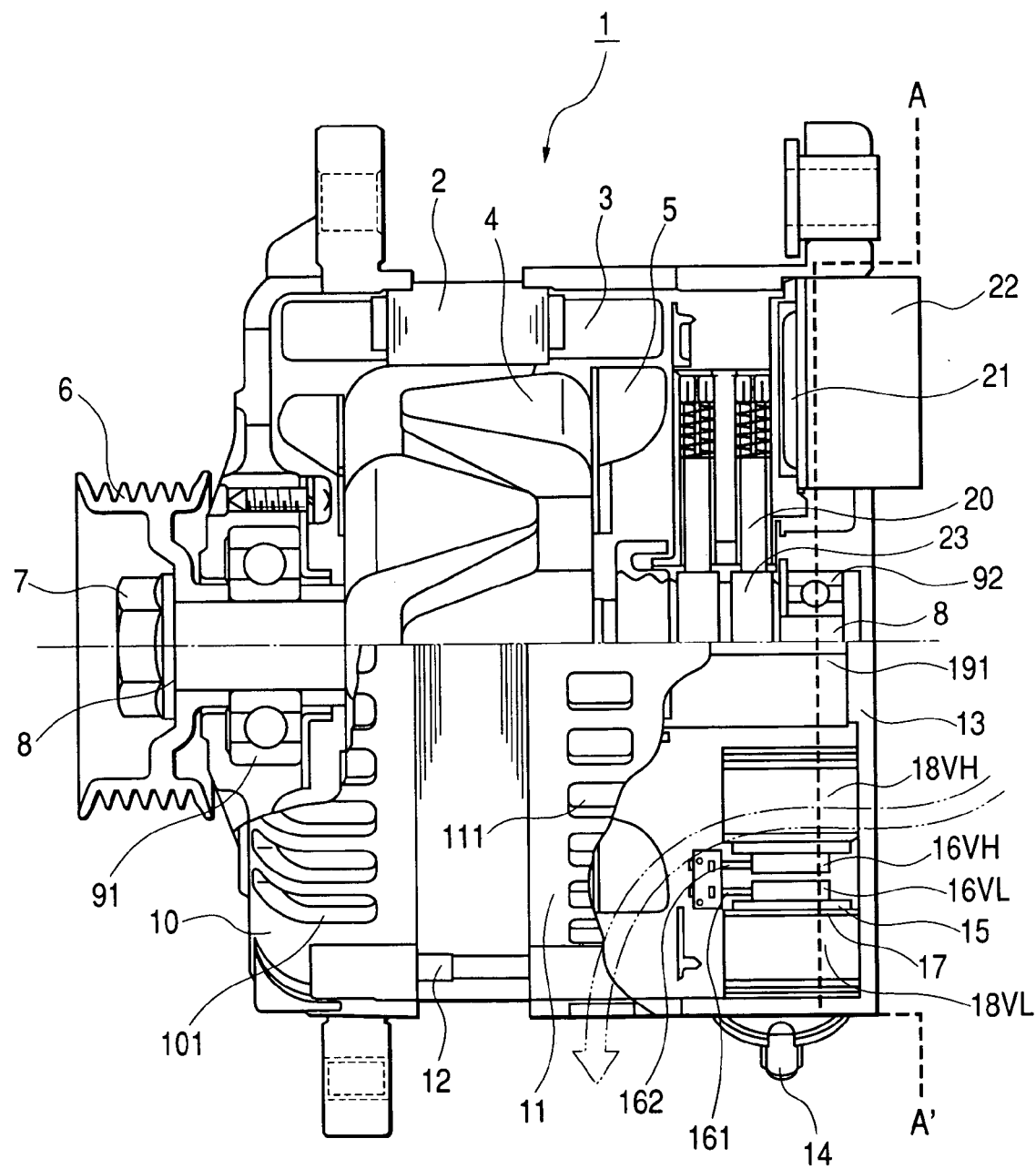
FIG. 1 illustrates a multi-phase alternating-current rotational electric machine according to an embodiment 1 of the present invention.
Figure 2:
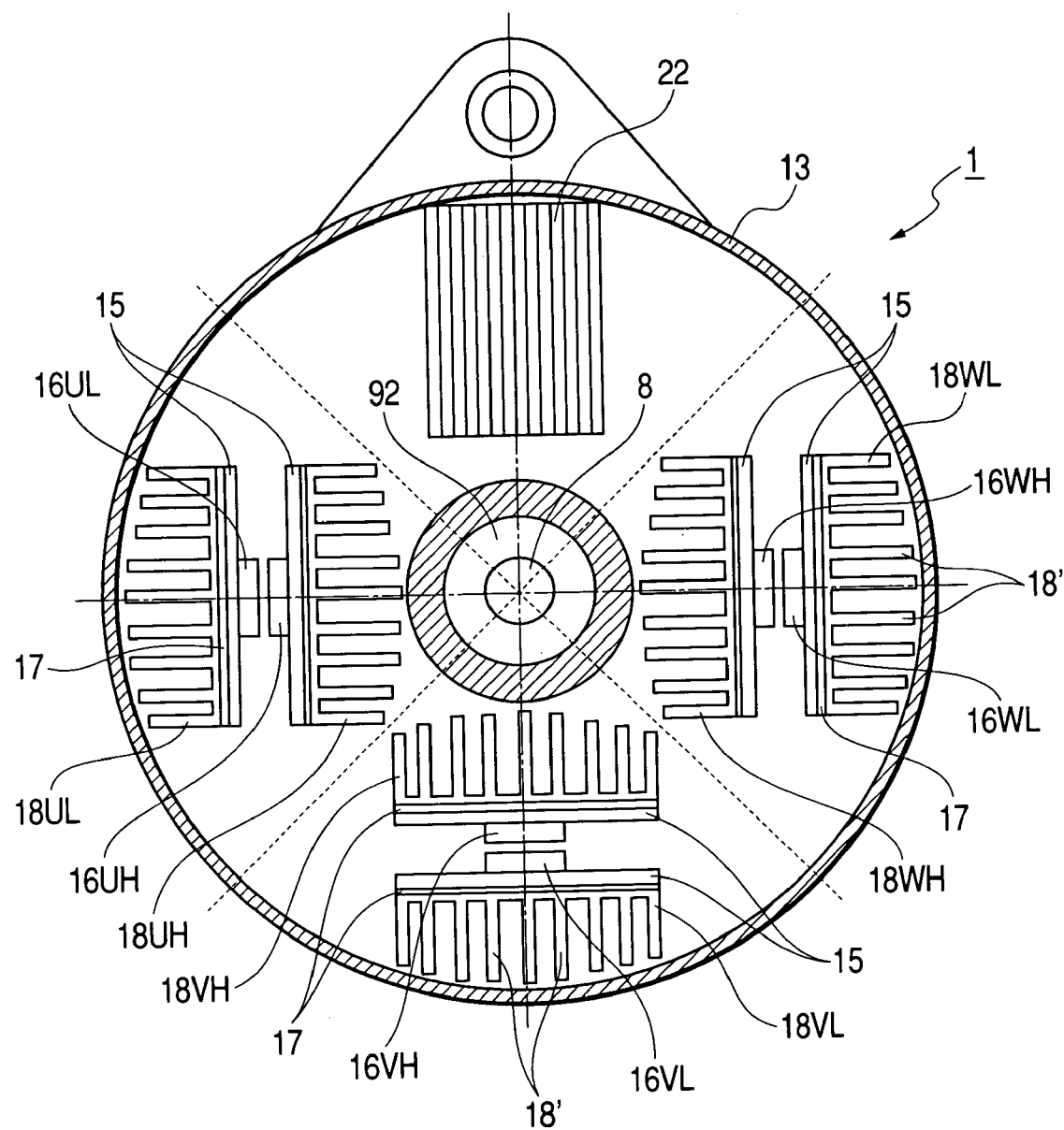
FIG. 2 illustrates the inside of the rotational electric machine viewed from the cooling-air inflow side with the rear cover 13, shown in FIG. 1, removed.

One preferred embodiment of the present invention will be described. FIG. 1 and FIG. 2 show a dynamo-electric machine according to an embodiment of the present invention. FIG. 1 illustrates the side surface (a partial cross section) of the rotational electric machine 1. FIG. 2 illustrates the inside viewed from the cooling-air inflow side with the rear cover 13, shown in FIG. 1, removed. In FIG. 2, for clarification, some components, such as wires (power line, gate drive line) and capacitors, are not shown.

Figure 3:
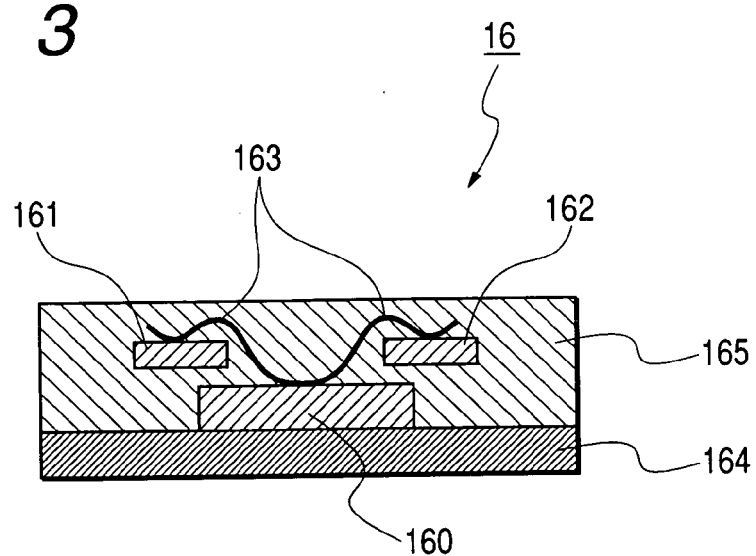
FIG. 3 is an enlarged cross-sectional view of a switching device package 16 according to embodiments 1 through 4 of the present invention.

FIG. 3 is a cross-sectional view of a switching device package 16 (16UH, 16UL, 16VH, 16VL, 16WH, and 16WL) in the rotational electric machine 1. The numeral 160 denotes a publicly known silicon power semiconductor die (Si-MOSFET) which is soldered to the first heat spreader and drain electrode 164 (material: copper) and connected to a source lead 161 and a gate lead 162 with aluminum wires 163 so that electricity can be conducted and their connections are molded by epoxy resin 165. Hereafter, a semiconductor die 160, first heat spreader 164, source lead 161, gate lead 162, aluminum wires 163, mold resin 165, and soldered portions (not shown) are, as a whole, called "switching device package".

Switching device packages 16UH, 16UL, 16VH, 16VL, 16WH, 16WL are soldered to the second heat spreader 15 (material: copper) to increase capability of heat discharge from the switching device packages. The second heat spreader 15 is fixed to the base surface of the aluminum heat sink 18 (18UH, 18UL, 18VH, 18VL, 18WH, 18WL) via an insulator 17, and the switching device package 16 is electrically insulated from the heat sink 18. Shapes of the heat sinks 18UH, 18UL, 18VH, 18VL, 18WH, 18WL are made identical for each U, V, and W phase.

Furthermore, a semiconductor die 160 is not limited to the MOSFET, but can be an IGBT or other semiconductor devices. Also, the material is not limited to silicon, but can be SiC (silicon carbide) or other power semiconductor materials. With respect to aluminum wires 163, any wire made of a material other than aluminum can be used as far as the continuity is secured. Moreover, this embodiment adopts a wire-bonding connecting method; however, a bonding-less method that connects the gate lead and the source lead to the semiconductor die's electrodes by electro-conductive paste can be applied so as to increase reliability.

In this embodiment, although copper is used for the first and second heat spreaders, any material can be used as far as it has good thermal conductivity. The semiconductor die 160 and the first heat spreader 164 are soldered; however, other connecting materials, such as electro-conductive paste, can be used instead of solder. The mold resin 165 can be replaced with any resin as far as the material can provide stress relaxation capability and resistance to environment for the semiconductor die and the vicinity.

It is desirable that an insulator 17 has a high thermal conductivity. In this embodiment, a high conductivity polymer sheet (thermal conductivity: 2.0 W/m·K) is used; however, as far as the switching device package 16 and the heat sink 18 are electrically insulated and good thermal conductivity is ensured, any configuration can apply, for example, by means of mounting an insulated ceramics circuit board, such as aluminum nitride, to a heat sink 18 via thermoconductive grease. Furthermore, in this embodiment, the semiconductor die 160 is mounted to the second heat spreader 15 via the first heat spreader 164; however, it can be directly mounted to the second heat spreader.

Figure 4:
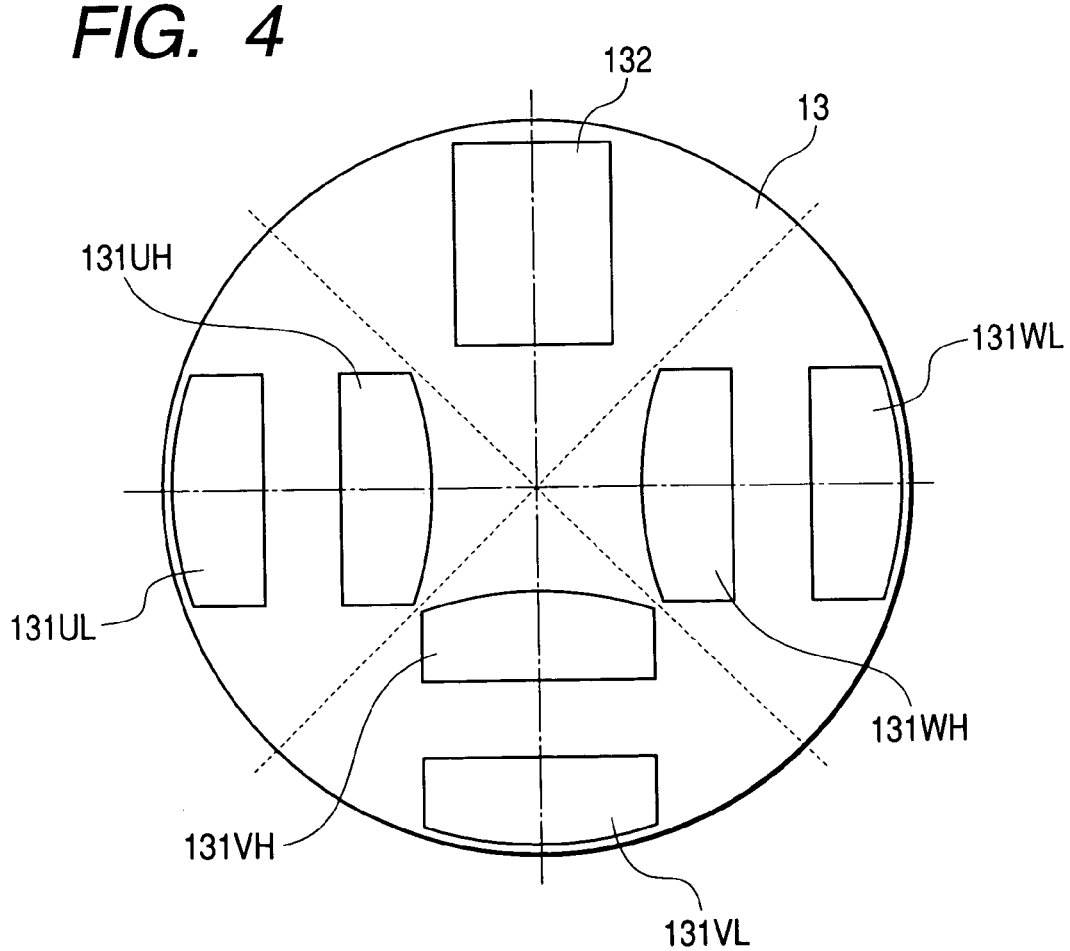
FIG. 4 illustrates the shape of the cooling-air openings in the rear cover 13 according to embodiment 1 of the present invention.

An aluminum alloy rear cover 13, shown in FIG. 4, is installed from the direction above the FIG. 2 (see FIG. 1) and is fixed to the heat sink 18 and the rear housing 11, providing a negative potential (body earth voltage), which is the same potential as the rear housing 11, for the heat sink. The rear cover 13 can be made of any material as far as it is electrically conductive.

Next, the effect of this embodiment will be described. According to this embodiment, each switching device package 16UH, 16UL, 16VH, 16VL, 16WH, 16WL is electrically insulated from the heat sink 18 and the heat sink 18 is grounded to the rear housing 11 via the rear cover 13 as well as thermally separated in each phase (UH, UL, VH, VL, WH, WL). This configuration allows the switching devices to be of the same channel type. That is, it is possible to avoid response variance at the high-speed switching caused by the use of different channel type devices.

Moreover, it is not necessary to insulate the positive heat sink from the housing (earth voltage), which is indispensable to the conventional integral construction, thereby avoiding restrictions to the shape and size of the heat sink as semiconductor device voltage capacity increases. As a result, in this embodiment, there is no possibility of short circuit between the externally exposed positive heat sink 18UH, 18VH, 18WH and the earth caused by metallic debris or of an operator receiving an electric shock.

Furthermore, thermal interference among the switching device packages 16UH, 16UL, 16VH, 16VL, 16WH, 16WL in each phase can be avoided, and temperatures of the device packages are individually determined in each phase. Therefore, temperature variance among the phases is determined according to the variance of internal resistance of the switching devices, and the variance does not affect other phases' temperatures, keeping the effect of the variance isolated within each phase.

As a consequence, when detecting the current of each phase, it is possible to beforehand add a temperature correction that matches each phase to the detected current, thereby increasing the accuracy of phase current detection.

The above-mentioned configuration is highly effective especially when it is applied to an integral rotational electric machine which incorporates silicon switching devices that have definite requirements for cooling devices and advanced feedback control compared to conventional devices (Si diode, SiC device), and it increases the efficiency and power capacity of the rotational electric machine.

FIG. 13 shows the temperature of each device in embodiment 1. Because an externally exposed large heat sink is available, each device is thoroughly cooled and each phase is thermally separated, which makes the temperature variance among devices smaller than that of the conventional example. Thus, the present invention is absolutely effective.

This embodiment shows a three-phase (U, V, W) rotational electric machine; however, it can apply to any other multi-phase rotational electric machine. Separating the heat sink 18 according to the number of phases will enable a similar effect to this embodiment to be obtained.

Furthermore, in this embodiment, heat sinks 18 are completely separated into positive and negative U, V, and W phases to effectively avoid temperature variance among devices. However, if the capacity of a dynamo-electric machine is relatively small and cost could be reduced by not separating the heat sinks, the heat sinks do not need to be separated. In this case, as far as the configuration dose not allow thermal interference among the phases (i.e. phases are substantially separated), it is possible to achieve the similar effect to this embodiment; that is, temperature variance among devices can be reduced.

(Embodiment 2)

Figure 5:
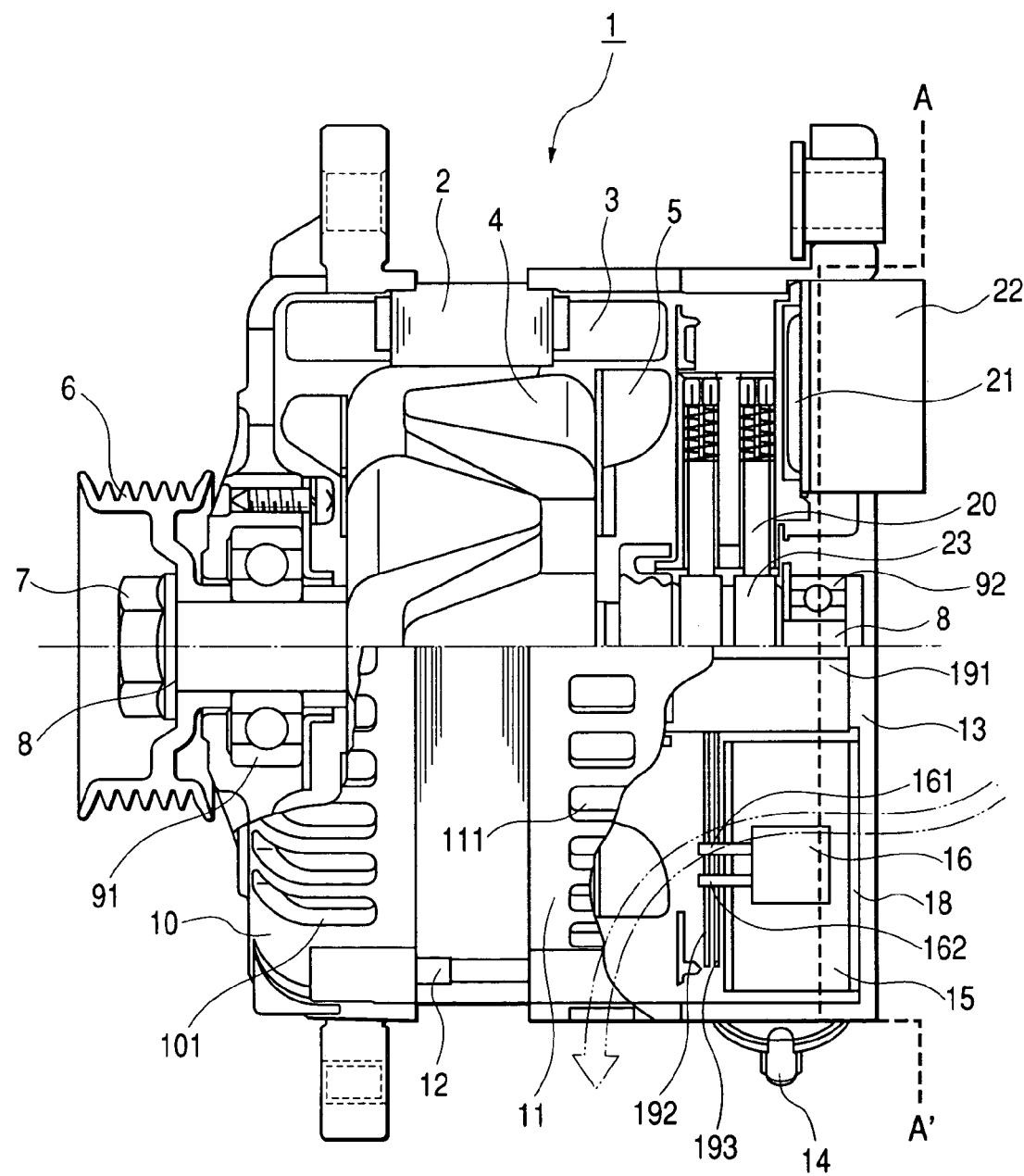
FIG. 5 illustrates a multi-phase alternating-current rotational electric machine according to embodiment 2 of the present invention.
Figure 6:
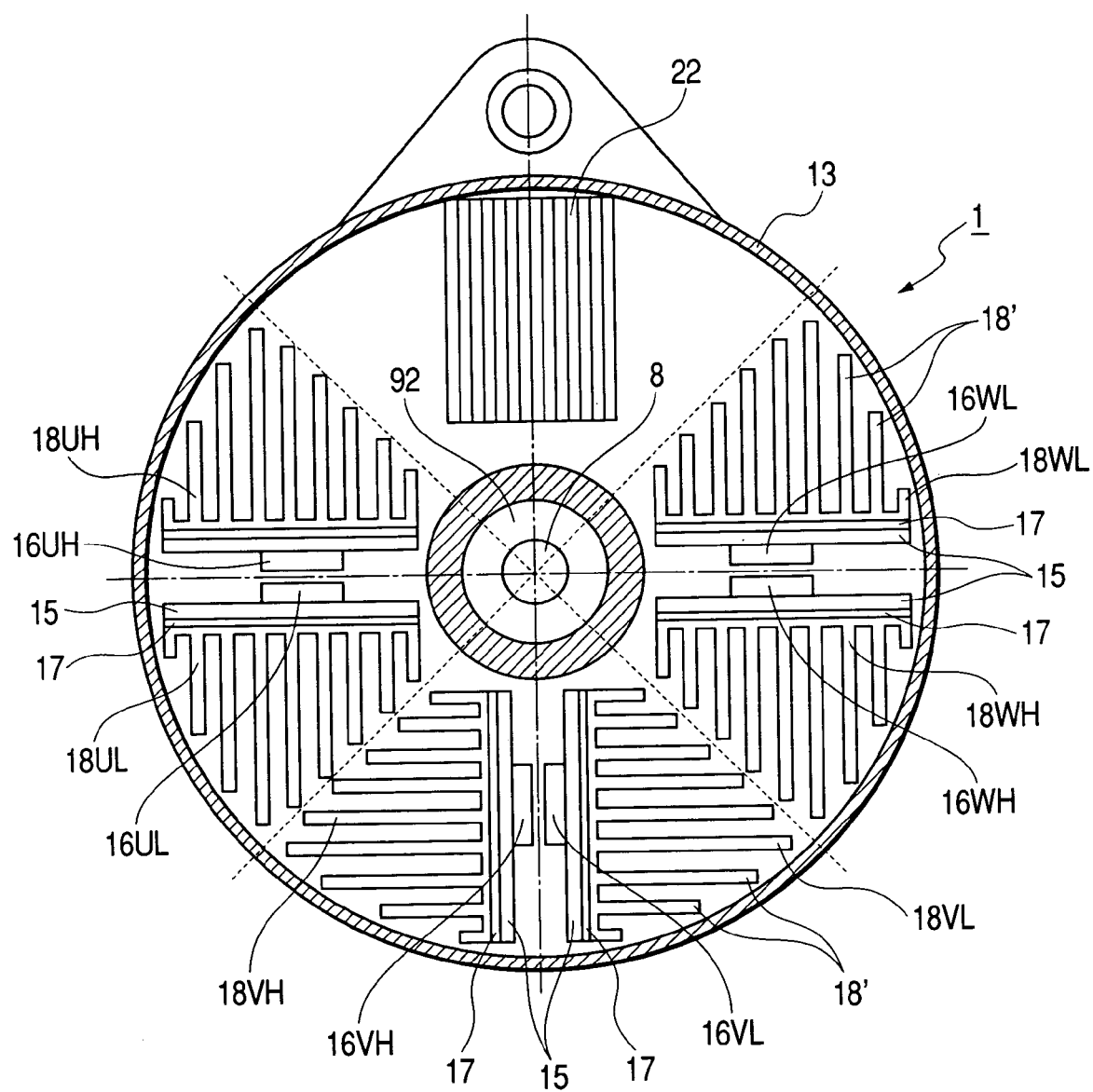
FIG. 6 illustrates the inside of the rotational electric machine viewed from the cooling-air inflow side with the rear cover 13, shown in FIG. 5, removed.

FIG. 5 and FIG. 6 show a rotational electric machine according to another embodiment of the present invention. FIG. 5 is a side view of the rotational electric machine (partial cross-sectional view). FIG. 6 illustrates the inside viewed from the cooling-air inflow side with the rear cover 13, shown in FIG. 5, removed. In FIG. 5, for clarification, some components, such as wires (power line, gate drive line) and capacitors, are not shown.

Figure 7:
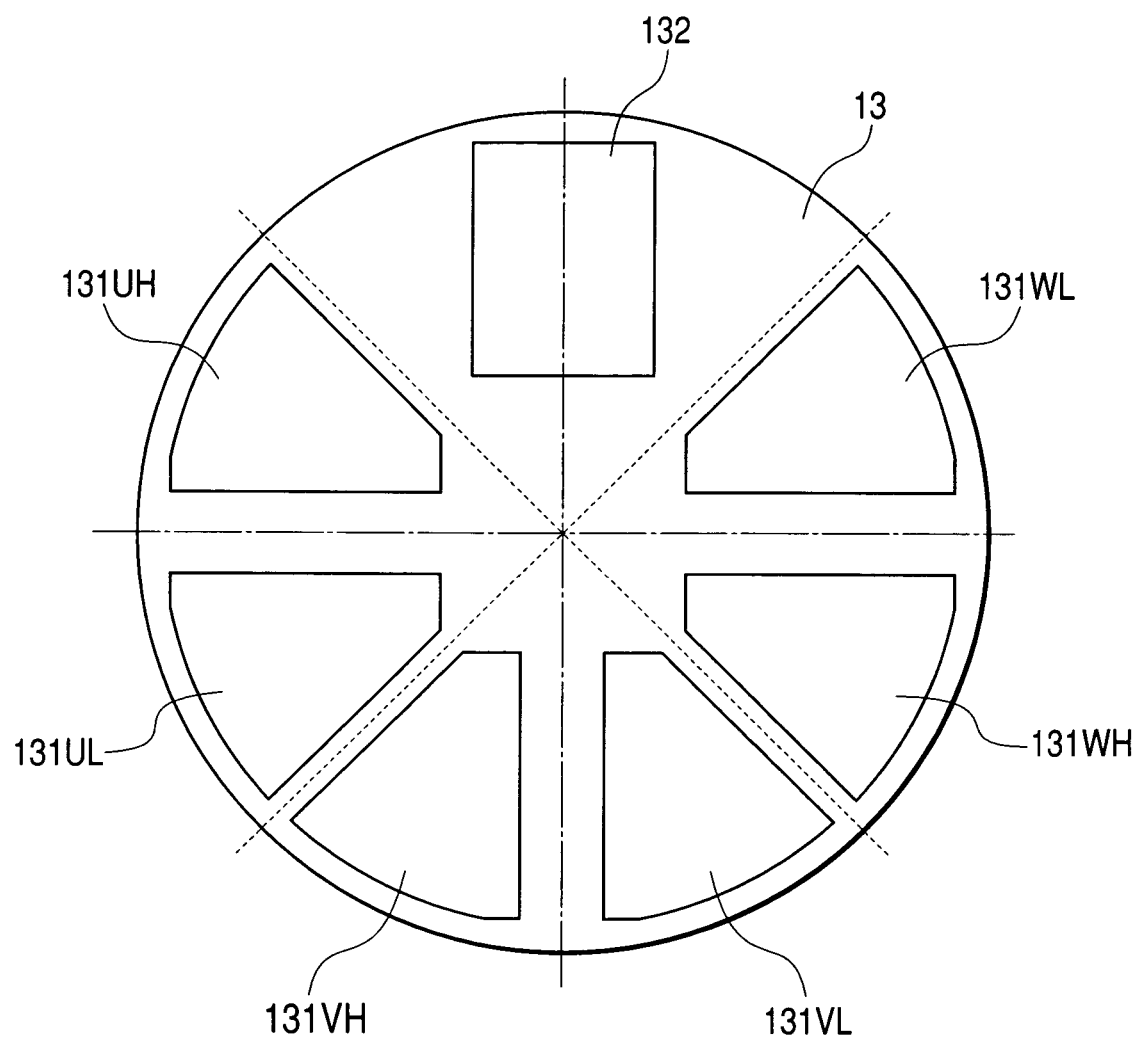
FIG. 7 illustrates the shape of the cooling-air inflow openings in the rear cover 13 according to embodiment 2 of the present invention.

In this drawing, an aluminum alloy rear cover 13, shown in FIG. 7 for explanation, has been removed; however, in the actual use, the rear cover 13 is installed from the direction above the drawing and is fixed to the heat sink 18 and the rear housing 11, providing negative potential (body earth voltage) for the heat sink.

The switching device package 16 is conductively mounted to the aluminum heat spreader 15 by silver paste. Herein, the configuration of the switching device package 16 is the same as that in FIG. 3, and the first heat spreader 164 is made of copper. In this case, the use of a second aluminum heat spreader 15 helps reduce weight and cost of the dynamo-electric machine 1.

Furthermore, in this embodiment, silver paste is used as a connecting material to ease the difference in thermal expansion coefficients between the first heat spreader 164 and the second heat spreader 15. The heat spreader 15 is fixed to the base surface of the aluminum heat sink 18 via an insulating layer 17. Shapes of the heat sinks 18 are identical for each U, V, W phase. Each heat sink 18UH, 18UL, 18VH, 18VL, 18WH, 18WL is arranged at each 45 degree angle to the center of the rotor shaft 8. Furthermore, in this embodiment, the base surface of the heat sink 18 is parallel to the direction of the diameter of said rotor shaft.

Figure 8A:
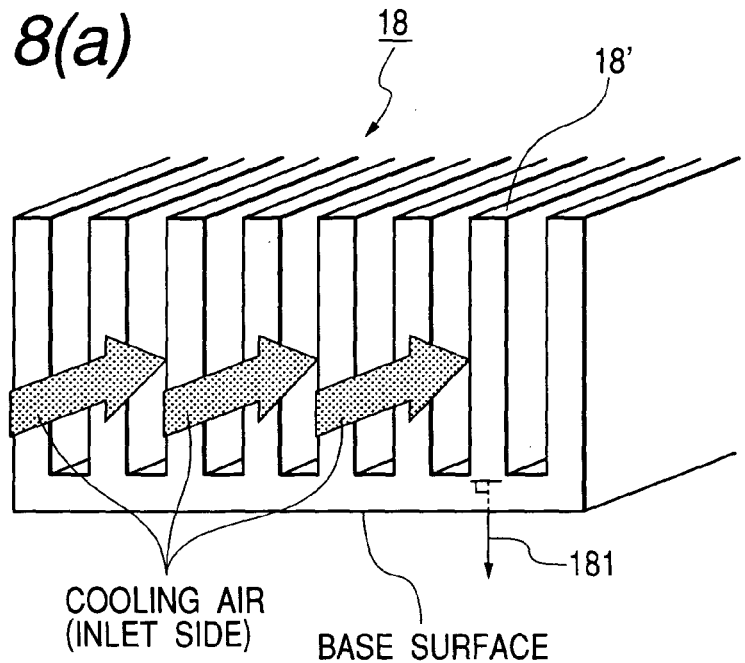
FIG. 8 schematically illustrates the shape of the heat sink 18 and the flow of cooling air in embodiments 1 and 2 according to the present invention.
Figure 8B:
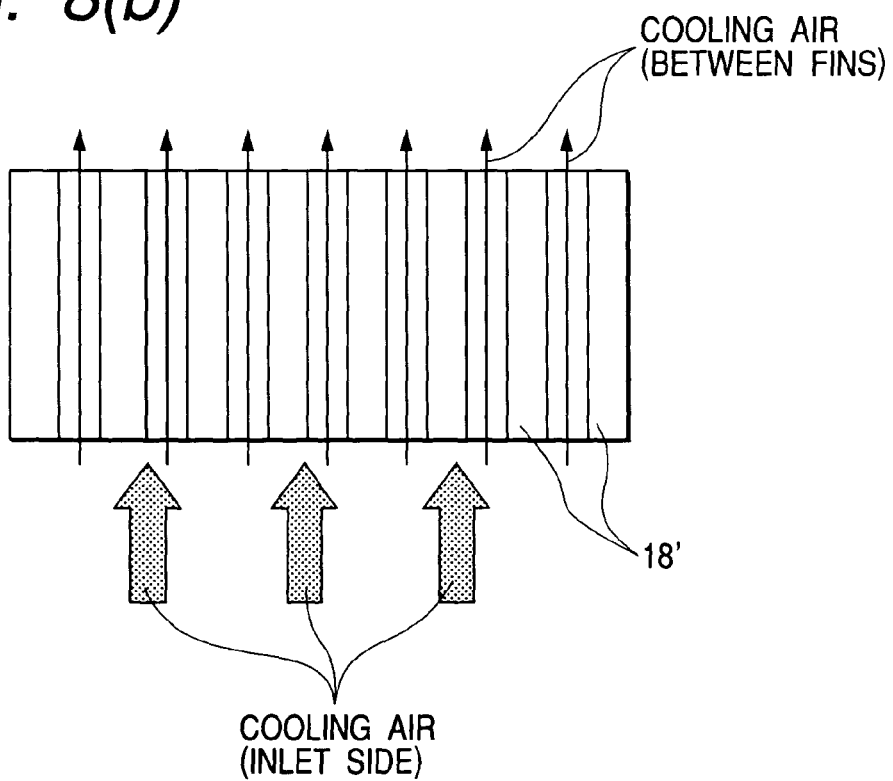

FIG. 8(a) schematically illustrates the flow of cooling air on the heat sink 18 with parallel plane fins, and FIG. 8(b) is a plan view of the base surface, shown in FIG. 8(a), viewed from directly above the side of fins 18'.

The flow of the cooling air will be described below with reference to FIG. 5 through FIG. 8.

First, cooling air that flows into the rear housing 11 is directed to the heat sink 18 through air flow openings 131 (131UH, 131UL, 131VH, 131VL, 131WH, 131WL) in the rear cover 13, shown in FIG. 5 and FIG. 7, and first passes through parallel plane fins 18' as schematically shown in FIG. 8. Herein, air flow openings 131 in the rear cover 13 are formed in accordance with the outer shape of the heat sink 18, as shown in FIG. 6, and the heat sink and the rear cover are completely fixed so that there is no clearance. Furthermore, a cutout 132 (FIG. 7) in the rear cover 13 is formed in accordance with the shape of the control IC board 21 so that the heat sink 22 of the control IC board 21 can be externally exposed. Therefore, the substantially full flow of the cooling air entering into said housing passes through the fins 18' of the heat sink 18. Moreover, the heat sink 18 is placed such that the normal vector 181 of its base surface is orthogonal to the direction of the cooling air flow (vertical direction to the drawing in FIG. 8(b)), thereby the air flows smoothly through the fins without any flow resistance.

Subsequently, the cooling air cools other portions (slip ring 23, stator coil winding 3, etc.) of the rotational electric machine 1 and then is discharged to the outside through the slit 111 in the rear housing 11.

Next, the effect of this embodiment will be described in terms of temperature variance among the devices. According to this embodiment, because each individually separated heat sink 18UH, 18UL, 18VH, 18VL, 18WH, 18WL for each switching device package 16UH, 16UL, 16VH, 16VL, 16WH, 16WL is of the same shape, thermal resistance when heat is conducted from the switching device package 16 to the heat sink 18 becomes constant thereby effectively reducing temperature variance among the devices. Furthermore, in this embodiment, because heat sinks 18 located inside the rear cover 13 are concentrically arranged with the rotor shaft 8 as the center, there is little variance in the amount of cooling air that flows onto each heat sink 18UH, 18UL, 18VH, 18VL, 18WH, 18WL. As a result, temperature variance among devices can effectively be reduced.

Next, the effect of this embodiment will be described in terms of cooling capability. When using silicon switching devices, as mentioned above, device temperatures must be made relatively lower than that of conventional rectifying Si diodes or SiC devices. Therefore, to achieve an integral rotational electric machine that incorporates silicon switching devices, mounting large heat sinks necessary for suppressing device temperatures under a tolerance within a limited space is indispensable.

Accordingly, as shown in this embodiment, by separating heat sinks according to each phase (U, V, and W in this embodiment), it is possible to mount the heat sinks with no clearance within the space in the cross-section of the rotor shaft while allowing for the appropriate size of the heat sink necessary for cooling the switching devices. Furthermore, by adopting the rear cover 13, shown in FIG. 5 and FIG. 7, the substantially full flow of the cooling air entering into the housing can be directed through the parallel plane fins 18' of the heat sink 18, thereby effectively maximizing the temperature reduction of the devices.

Moreover, the cutout 132 in the rear cover 13 is formed in accordance with the shape of the control IC board so that the heat sink 22 of the control IC board 21 can be externally exposed, and there is no possibility that air can flow into the housing through this cutout.

Furthermore, in this embodiment, the switching device package 16 is electrically insulated from the heat sink 18, and the heat sink is fixed to the rear housing (earth voltage) 11 via the rear cover 13 thereby having a negative potential (body earth voltage). As a result, there is no possibility of short circuit or an operator receiving an electric shock because of the externally exposed heat sink 18 coming in contact with a foreign object. It goes without saying that the above-mentioned configuration can be adopted because the switching device package 16 is electrically insulated from the heat sink 18.

FIG. 13 shows the temperature of each switching device in this embodiment. It is observed that devices are thoroughly cooled and there is no substantial temperature variance among the devices. Thus, the present invention is absolutely effective.

This embodiment shows a three-phase (U, V, W) rotational electric machine; however, it can apply to any other multi-phase rotational electric machine. Separating heat sinks 18 according to the number of phases will enable the similar effect to this embodiment to be obtained.

Furthermore, the heat sink 18 in this embodiment has parallel plane fins, as shown in FIG. 8; however, other shapes shown in FIG. 9 and FIG. 10 can be applied.

Figure 9A:
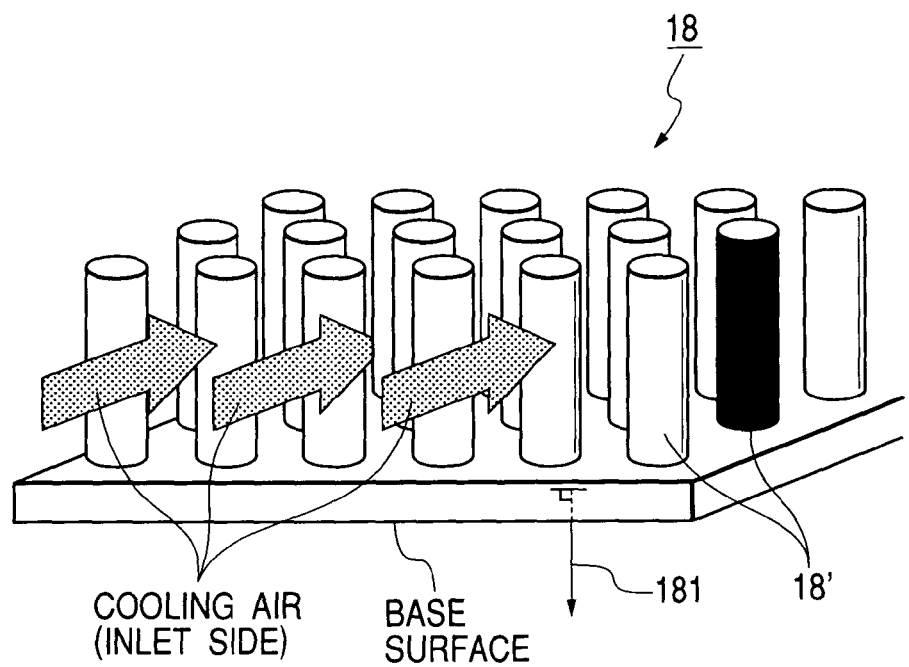
FIG. 9 illustrates the shape of another heat sink that can be applied to the present invention.
Figure 9B:
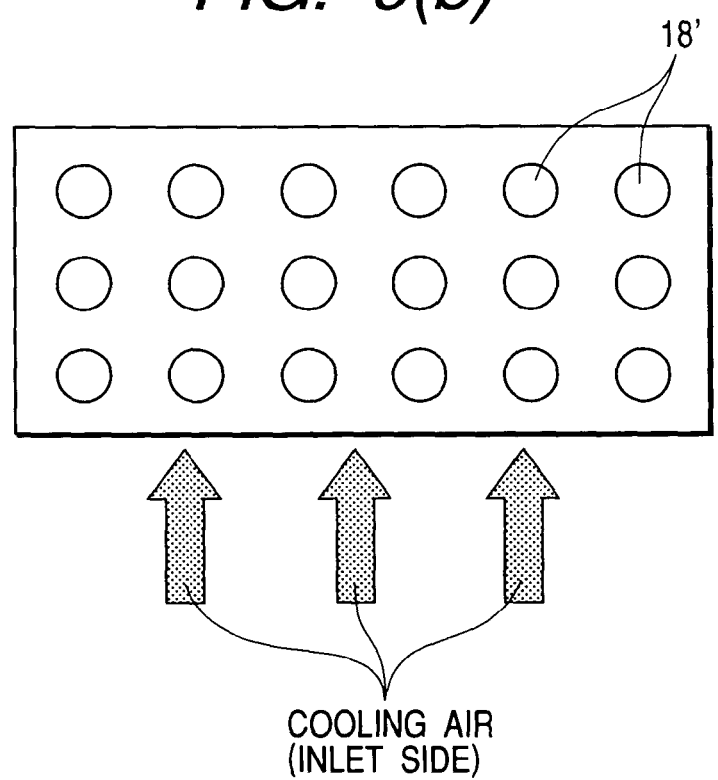
Figure 10A:
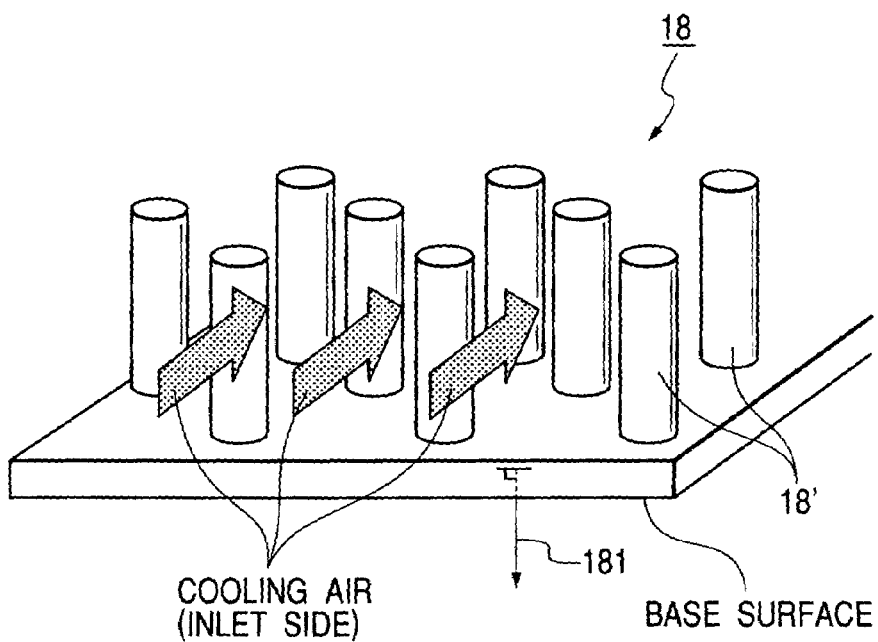
FIG. 10 illustrates the shape of another heat sink that can be applied to the present invention.
Figure 10B:
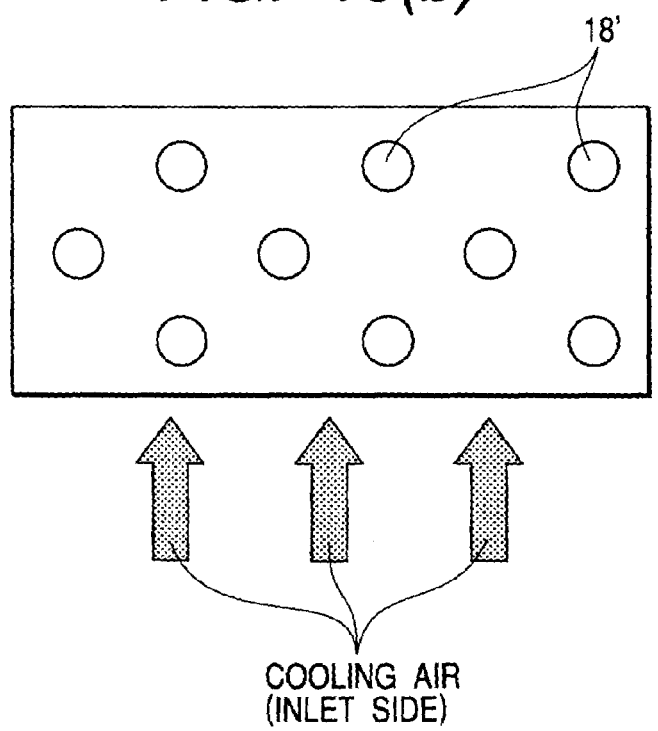

FIG. 9 and FIG. 10 are schematic views of the heat sink on which columnar fins 18' are arranged on the base surface. FIG. 9(a) and FIG. 10(a) are perspective views and FIG. 9(b) and FIG. 10(b) are plan views. In FIG. 9, fins 18' are arranged on the base surface in a lattice-like configuration, and in FIG. 10, fins 18' are arranged on the base surface in a staggered configuration.

As far as the base surface is parallel to the direction of the diameter of the rotor shaft, the use of either heat sink arrangement makes it possible to mount the heat sinks with no clearance within the space in the rotor shaft cross-section. Consequently, a similar effect to the heat sink, shown in FIG. 8, can be obtained. Furthermore, the fin should be columnar regardless of circular cylinder or square column. Moreover, any shape, such as cone (circular cone, pyramid), can be applied as far as desirable cooling capability can be obtained.

As stated above, in this embodiment, it is possible to eliminate temperature variance among devices while achieving necessary device cooling capability. As a consequence, the configuration is highly suitable for an integral rotational electric machine that incorporates silicon switching devices.

(Embodiment 3)

In embodiment 2, one switching device is provided for each heat sink 18UH, 18UL, 18VH, 18VL, 18WH, 18WL; however, two or more switching devices can be mounted in parallel. In this case, because heat sinks 18 have been separated in each U, V, and W phase, there is no substantial variance in cooling capability among the phases. Furthermore, temperature variance among devices mounted in parallel in each phase can be significantly reduced by optimizing locations, at which switching device packages 16 are mounted to the heat sink 18, based on simple temperature analysis results.

Figure 11:
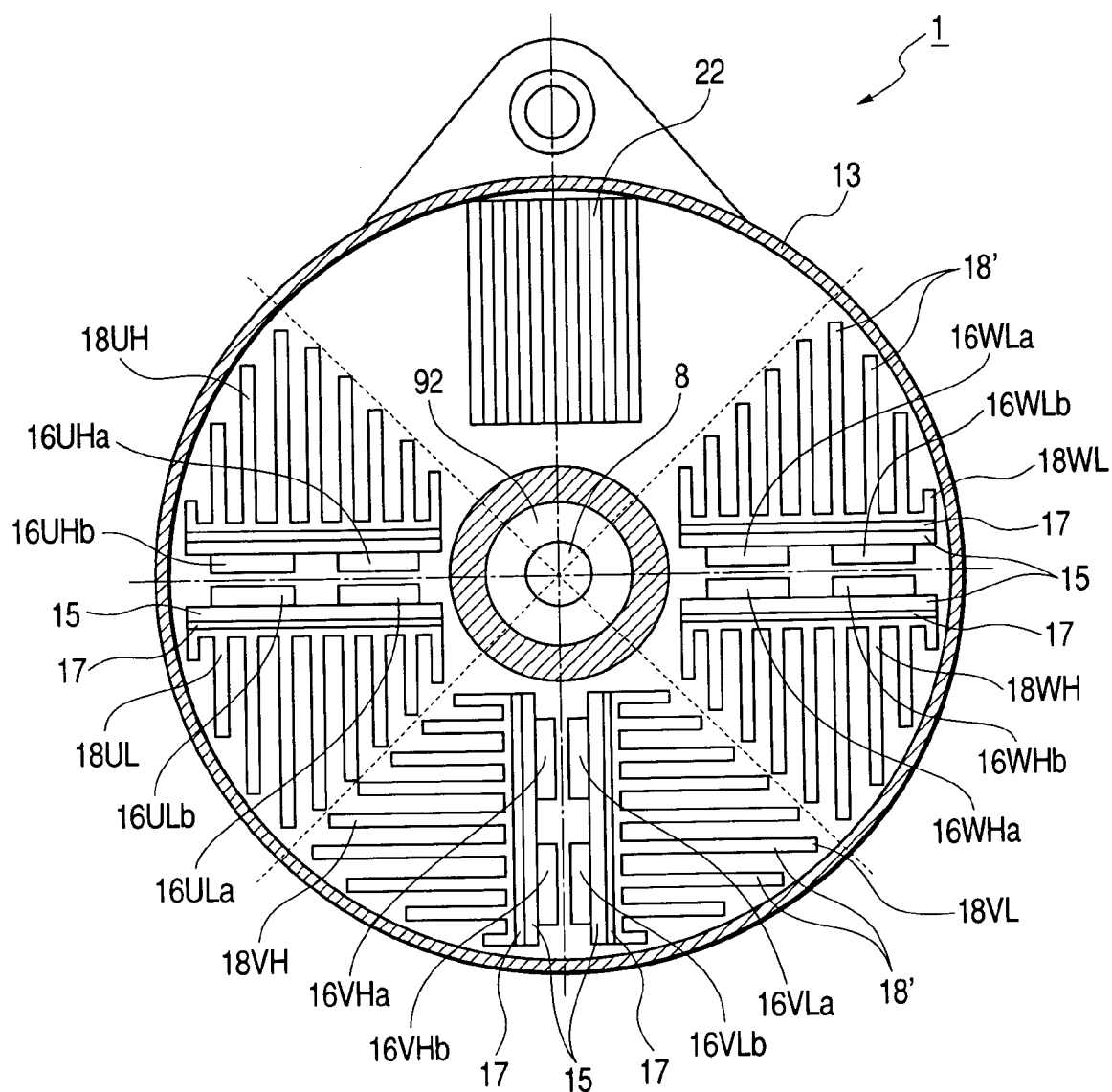
FIG. 11 illustrates the inside of the rotational electric machine viewed from the cooling-air inflow side, with the rear cover 13 removed, in a multi-phase alternating-current rotational electric machine according to embodiment 3 of the present invention.

FIG. 11 shows an example in which two devices are mounted in parallel in each phase in embodiment 2. The drawing also shows the temperature of each device when locations at which the devices are mounted to the heat sink 18 are optimized. Consequently, temperature variance among the devices is smaller than the conventional example, indicating that the present invention is significantly effective.

(Embodiment 4)

Figure 12:
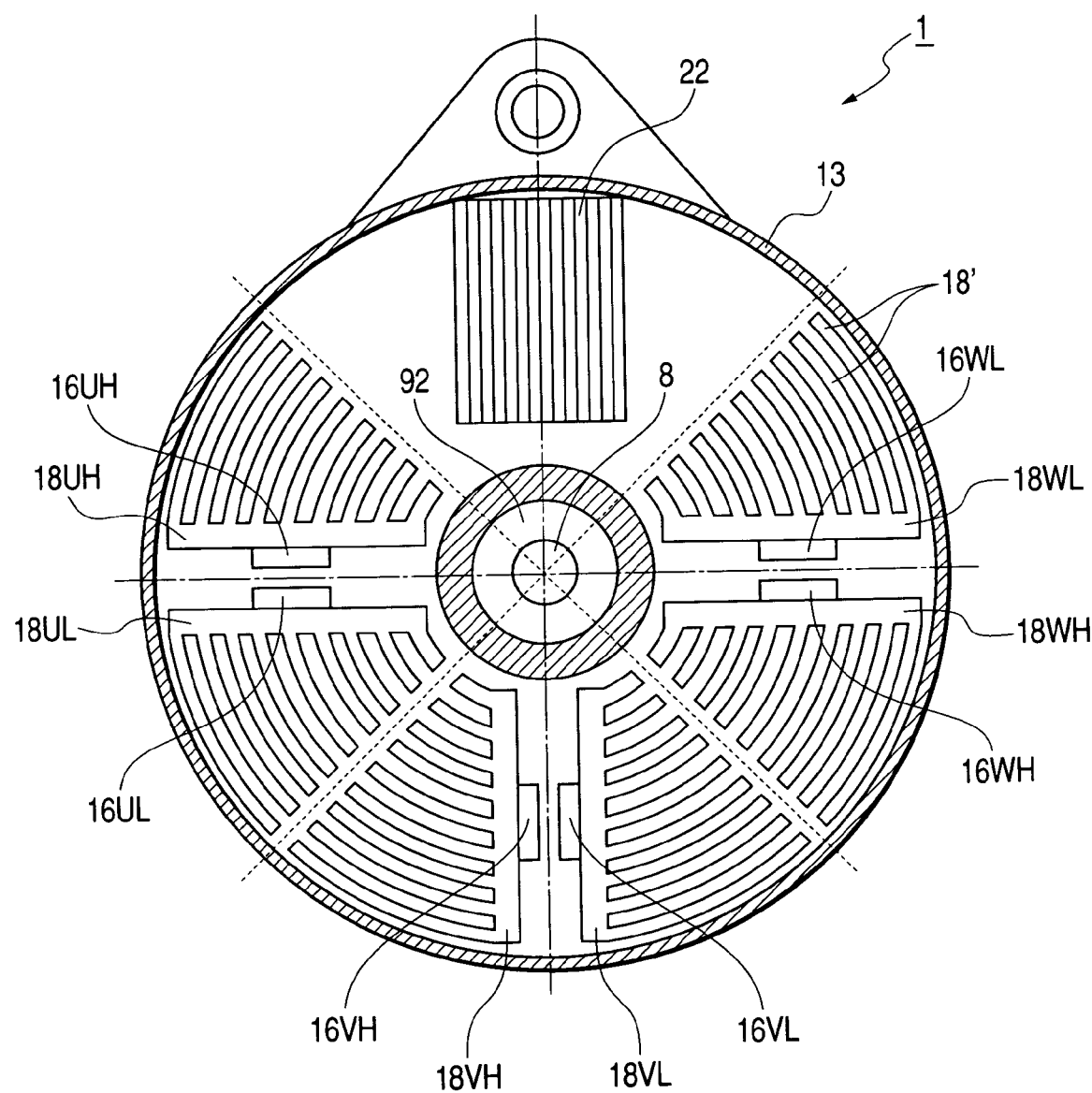
FIG. 12 illustrates the inside of the rotational electric machine viewed from the cooling-air inflow side, with the rear cover 13 removed, in a multi-phase alternating-current rotational electric machine according to embodiment 4 of the present invention.

FIG. 12 shows another embodiment of the present invention. In this embodiment, the heat sink is produced such that fins 18' are concentrically arranged with the rotor shaft 8 as the center. This makes it possible to eliminate geometrically unnecessary space when heat sinks are placed in the cross-section of the rotor shaft, thereby maximizing the size of the heat sink 18.

Therefore, in this embodiment, switching device packages 16 are thoroughly cooled without having a second heat spreader 15 which is incorporated in the embodiments 1 through 3, thereby reducing the number of components and production cost. In this embodiment, the first heat spreader 164 in the switching device package 16 is fixed to the base surface of the heat sink 18 by adhesives that has high thermal conductivity and is electrically insulated.

Therefore, according to this embodiment, especially in an air-cooling system rotational electric machine, it is possible to eliminate temperature variance among devices while achieving maximum cooling capability as well as maximizing the size of the fins allocated to each phase. Accordingly, it is possible to thoroughly cool switching devices without using a second heat spreader 15. Moreover, the second heat spreader 15 can also apply to this embodiment. In this case, it is possible to make device temperature lowest.

FIG. 13 shows the temperature of the switching devices in this embodiment. Each device is thoroughly cooled, and temperature variance among the devices can be smaller than the conventional example. Thus, the present invention is significantly effective.

Reference signs show the following parts:
1 . . . Multi-phase alternating-current rotational electric machine, 2 . . . Stator core, 3 . . . Stator coil winding, 4 . . . Rotor, 5 . . . Inner fan, 6 . . . Pulley, 7 . . . Nut, 8 . . . Rotor shaft, 10 . . . Front housing, 11 . . . Rear housing, 12 . . . Screw, 13 . . . Rear cover, 14 . . . Output electrode, 15 . . . Second heat spreader, 16 (16UH, 16UL, 16VH, 16VL, 16WH, 16WL) . . . Switching device package, 17 . . . Insulator, 18 (18UH, 18UL, 18VH, 18VL, 18WH, 18WL) . . . Heat sink, 18' . . . Fin, 20 . . . Brush, 21 . . . Control IC board, 22 . . . Control IC heat sink, 23 . . . Slip ring, 91 . . . Front bearing, 92 . . . Rear bearing, 131 (131UH, 131UL, 131VH, 131VL, 131WH, 131WL) . . . Air flow opening, 132 . . . Cutout for IC heat sink, 160 . . . Switching device, 161 . . . Source lead, 162 . . . Gate lead, 163 . . . Aluminum wires, 164 . . . First heat spreader, 165 . . . Mold resin, 191 . . . Power line, 192 . . . Power line, 193 . . . Gate drive line.

According to the present invention, it is possible to provide a multi-phase alternating-current rotational electric machine which eliminates temperature variance among multiple devices, completely insulates high voltage devices from the ground and also has an appropriate configuration suitable for semiconductor switching devices, such as MOS-FETs, IGBTs, etc.

Furthermore, it goes without saying that the present invention can apply to a rotational electric machine which incorporates existing Si diodes or SiC switching devices, and it can achieve excellent device cooling capability with no variance and is suitable for high voltage devices, which is a similar effect to the present invention.

What is claimed is:

1. A multi-phase alternating-current rotational electric machine comprising:
a housing,
a rotor shaft rotatably installed in the housing,
a magnetized rotor fixed to the rotor shaft,
a stator which is arranged such that the windings of the stator coil are wound around the stator core fixed to the housing,
multiple semiconductor switching devices, installed in the housing, which adjust currents of the stator, and
heat sinks fixed to the respective semiconductor switching devices so that heat can be conducted, wherein
the semiconductor switching devices are electrically insulated from the heat sinks, and the heat sinks are grounded to the housing as well as completely separated into positive and negative U, V, and W phases.

2. A multi-phase alternating-current rotational electric machine according to claim 1, wherein
multiple fins are arranged on the base surface of said heat sink and the substantially full flow of the air entering into said housing passes through the multiple fins.

3. A multi-phase alternating-current rotational electric machine according to claim 2, wherein
said multiple fins located on the base surface of said heat sink are columnar and the multiple columnar fins are arranged on the base surface in a lattice-like configuration.

4. A multi-phase alternating-current rotational electric machine according to claim 2, wherein
said multiple fins located on the base surface of said heat sink are columnar and the multiple columnar fins are arranged on the base surface in a staggered configuration.

5. A multi-phase alternating-current rotational electric machine according to claim 1, wherein
multiple fins are arranged on the base surface of said heat sink and a cover, which has an opening almost identical to the projection of the heat sink in the direction of said rotor shaft, is provided.

6. A multi-phase alternating-current rotational electric machine according to claim 5, wherein
said multiple fins of said heat sink are concentrically arranged with said rotor shaft as the center.

7. A multi-phase alternating-current rotational electric machine comprising:
a housing,
a rotor shaft rotatably installed in the housing,
a magnetized rotor fixed to the rotor shaft,
a stator which is arranged such that the windings of the stator coil are wound around the stator core fixed to the housing,
multiple semiconductor switching devices, installed in the housing, which adjust currents of the stator, and
heat sinks fixed to the respective semiconductor switching devices so that heat can be conducted, wherein
the semiconductor switching devices are electrically insulated from the heat sinks, the heat sinks are grounded to the housing as well as completely separated into positive and negative U, V and W phases, and the temperature of the multiple semiconductor switching devices are substantially determined in each phase.

* * * * *